United States Patent [19]

Neher

[11] Patent Number: 4,807,891
[45] Date of Patent: Feb. 28, 1989

[54] ELECTROMAGNETIC PULSE ROTARY SEAL

[75] Inventor: Clarence W. Neher, Lake Arrowhead, Calif.

[73] Assignee: The United States of America as represented by the Secretary of the Air Force, Washington, D.C.

[21] Appl. No.: 69,999

[22] Filed: Jul. 6, 1987

[51] Int. Cl.[4] .......... F16J 15/34; F16J 15/54; H05K 9/00

[52] U.S. Cl. .............. 277/80; 174/35 GC; 277/95; 277/96.2; 277/212 FB; 277/901

[58] Field of Search ........... 277/80, 1, 901, 212 FB, 277/89, 90, 96.2, 95; 174/35 GC, 35 C

[56] References Cited

U.S. PATENT DOCUMENTS

| | | | |
|---|---|---|---|
| 1,368,253 | 2/1921 | Fulton | 277/212 FB |
| 1,635,482 | 7/1927 | Joyce | 277/229 X |
| 1,765,443 | 6/1930 | Peterson | 174/35 GC |
| 2,075,444 | 3/1937 | Koehring | 277/96.2 X |
| 2,083,438 | 6/1937 | Dube | 277/212 FB |
| 2,747,166 | 5/1956 | Hoffarth | 174/35 GC X |
| 3,128,104 | 4/1964 | Teske . | |
| 3,277,230 | 10/1966 | Stickney et al. | 174/35 GC |
| 3,469,851 | 9/1969 | Enemark | 277/96.2 X |
| 3,502,784 | 3/1970 | Kunkel . | |
| 3,504,095 | 3/1970 | Roberson et al. | 277/901 X |
| 3,561,826 | 2/1971 | Cavy et al. . | |
| 3,810,637 | 5/1974 | Bonvin | 277/96.2 |
| 3,917,288 | 11/1975 | Hüber et al. . | |
| 4,061,413 | 12/1977 | Keller . | |
| 4,103,905 | 8/1978 | Desmond et al. . | |
| 4,106,839 | 8/1978 | Cooper . | |
| 4,153,258 | 5/1979 | Hüber et al. . | |
| 4,330,166 | 5/1982 | Cooper . | |
| 4,451,046 | 5/1984 | Bliven . | |
| 4,531,805 | 7/1985 | Werth . | |
| 4,583,809 | 4/1986 | Werth et al. . | |
| 4,598,959 | 7/1986 | Selvin . | |

FOREIGN PATENT DOCUMENTS

| | | | |
|---|---|---|---|
| 1956759 | 5/1971 | Fed. Rep. of Germany | 277/901 |
| 897207 | 3/1945 | France | 174/35 GC |
| 1321140 | 6/1973 | United Kingdom | 174/35 GC |

OTHER PUBLICATIONS

SPIRA Manufacturing Corporation product information sheets.

Primary Examiner—Allan N. Shoap
Attorney, Agent, or Firm—Fredric L. Sinder; Donald J. Singer

[57] ABSTRACT

An rotary seal for protection against electromagnetic interference and electromagnetic pulses is disclosed. An electrically conductive resilient bellows surrounds a shaft extending through an opening in an enclosure. The bellows is attached at one end to the shaft and biased against the enclosure at the other end. The attachment of the bellows to the shaft includes a static electromagnetic seal.

2 Claims, 1 Drawing Sheet

ELECTROMAGNETIC PULSE ROTARY SEAL

RIGHTS OF THE GOVERNMENT

The invention described herein may be manufactured and used by or for the Government of the United States for all governmental purposes without the payment of any royalty.

BACKGROUND OF THE INVENTION

The present invention relates generally to electromagnetic interference and electromagnetic pulse seals, and more specifically to a novel electromagnetic pulse rotary seal.

Electrical circuitry often must be protected from disruptions caused by electromagnetic interference (EMI) entering the system. External EMI energy is an undesired conducted or radiated electrical disturbance that can interfere with the operation of electronic equipment. With the development of nuclear explosives another type of electromagnetic radiation has been observed. A nuclear explosion, and in some circumstances large scale chemical explosions, produces a sharp pulse (large impulse-type) of radio frequency (long wave length) electromagnetic radiation. The intense electric and magnetic fields created by electromagnetic pulse (EMP) energy can damage unprotected electrical and electronic equipment over a wide area. As a result, a demand has appeared for seals having substantial shielding effectiveness against EMI and EMP energy threats.

Prior art development of EMI and EMP seals has primarily concentrated on two types of seals: electrical connectors, as illustrated in U.S. Pat. No. 4,330,166 to Cooper et al; and, static housing or gasket seals for equipment cabinets, as illustrated in U.S. Pat. No. 4,061,413 to Keller. The prior art does not disclose dynamic seals to provide shielding against EMI and EMP energy at the intersection of part surfaces moving in relation to one another as, for example, at the line where a rotating shaft extends through a housing.

It is, therefore, a principal object of the present invention to provide a dynamic seal that will effectively shield against EMI and, particularly, EMP radiation.

It is another object of the present invention to provide a rotary seal for a rotating shaft extending from an opening in a housing.

A feature of the present invention is that it automatically compensates for manufacturing tolerances in its construction, axial misalignment, or any other unpredictable part movement tending to interrupt the seal.

An advantage of the present invention is that it is easily inserted and removed.

Another advantage of the present invention that it may be easily retrofitted to existing equipment.

SUMMARY OF THE INVENTION

The present invention provides an EMP rotary seal. The unique discovery of the present invention is that the problem of providing shielding against EMI and EMP between parts moving in rotation to one another may be solved with the use of a resilient metal bellows, fixed at one end to a shaft and resiliently biased against the enclosure surrounding the shaft at the other. The resilient bellows automatically compensates for manufacturing tolerances in its construction, axial misalignment, or any other unpredictable part movement tending to interrput the seal.

Accordingly, the present invention is directed to an electromagnetic pulse rotary seal comprising an electromagnetically conductive resilient bellows surrounding a shaft outside an enclosure opening through which the shaft extends, the bellows having first and second open ends, the first open end attached to the shaft and the second open end biased against the enclosure around the enclosure opening.

The invention may further include a coating over the surface area of the bellows and/or the enclosure in contact with each other. The coating may be tin.

The invention may also include a passivated surface area on the surface areas of the bellows and/or the enclosure in contact with each other.

The invention may additionally include a static EMI seal installed between the bellows and shaft at the attachment of the bellows shaft.

The invention also includes the method of using a resilient bellows to achieve an electromagnetic seal around a shaft through an opening in an enclosure.

DESCRIPTION OF THE DRAWINGS

The present invention will be more clearly understood from a reading of the following detailed description in conjunction with the accompanying drawings wherein.

DETAILED DESCRIPTION

Figure 1:
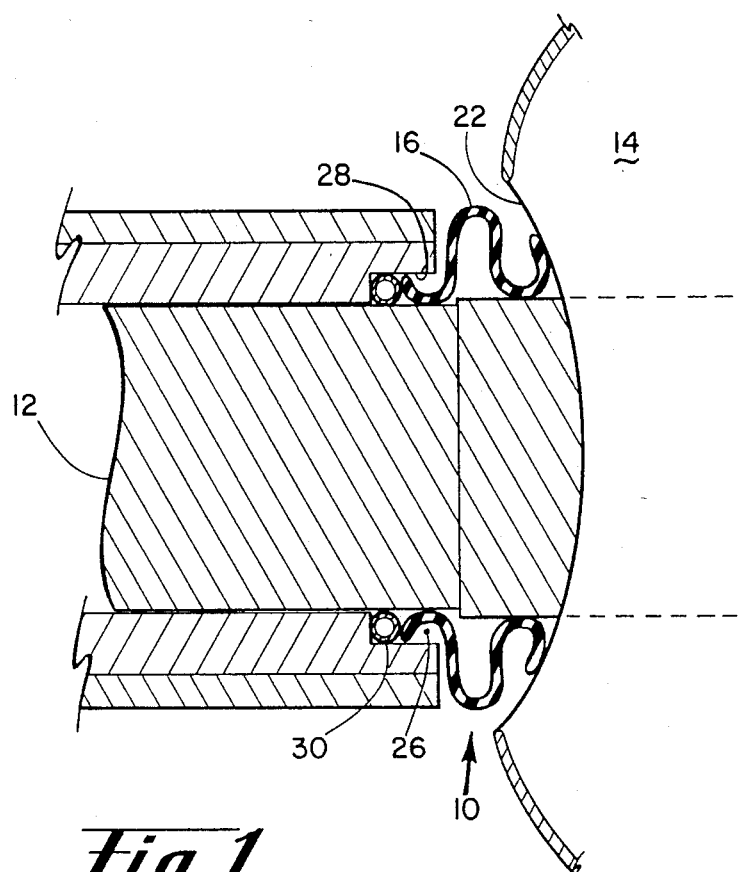
FIG. 1 is a cross-sectional view of a bellows-type EMP rotary seal sealing a rotating shaft extending from an enclosure; and, FIG. 2 is a perspective view of the bellows-like construction of the spring-loaded EMP rotary seal.
Figure 2:
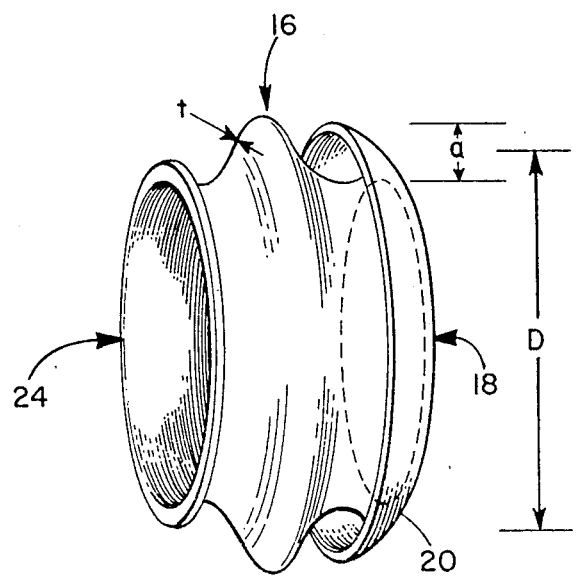

Referring now to FIG. 1 of the drawings, there is shown a cross-sectional view of a bellows-type EMP rotary seal 10 sealing a shaft 12 extending from an enclosure 14. The primary seal component is a resilient bellows 16 made from 0.010 inch corrosion resistant stainless steel. A free-standing perspective view of bellows 16 is shown in FIG. 2. One open end 18 of bellows 16 has a wiping surface 20 resiliently biased against the outside surface 22 of the enclosure 14 surrounding shaft 12. The other open end 24 of bellows 16 fits into an annular slot 26 defined by flange 28 which rotates with shaft 12. Bellows 16 is held transversely in place by its resilient biasing between slot 26 and enclosure outside surface 22. It is held radially in place by its own stiffness augmented by flange 28 and the curvature of enclosure outside surface 22.

A standard static EMI gasket 30 rests inside annular slot 26 between shaft 12 and bellows open end 24. EMI gasket 30 provides EMI and EMP shielding between bellows 16 and shaft 12 without requiring welding or other more permanent attachment which would reduce the ease of assembly and disassembly provided by the described embodiment. The attachment of bellows 16 to shaft 12 preferably will not result in relative movement between them so that bellows 16 will rotate with shaft 12 and relatively only to enclosure 14. It is not required, however, that the attachment be completely fixed. Suitable static EMI gaskets are available from Spira Manufacturing Corporation, Burbank, Calif., and from Technit, Santa Barbara, Calif.

The spring force constant of the bellows preferably should be chosen to result in a force of approximately 30 lbs. against the enclosure at its normal assembled deflection. The spring force constant may be determined from equations readily available to those with skill in the art. One equation for determination of the spring rate of a bellows is Spring Force Constant=1-.2ED(t/a)$^3$, where E is the modulus of elasticity of the bellows material, D is the diameter of the bellows measured from the centerline of the bellows spring wall, t is the thickness of the bellows material and a is the depth of the bellows spring wall. A 30 lb. force produces an acceptable corresponding deflection in static EMI gasket 30.

The seal between bellows surface 20 and enclosure surface 22 may be improved by application of various coatings or surface treatments to either or both bellows and enclosure. A suitable coating is flame sprayed tin. A suitable surface treatment is passivating. Passivating comprises the use of a nitric acid, sodium dichromate or other materials to remove foreign metals from the surface of stainless or other steels to improve corrosion resistance. Those with skill in the art will readily see other methods for improving the quality of the seal between bellows and enclosure and protecting against wear problems such as, for example, pitting.

The electromagnetic shielding provided by the steel bellows includes shielding from both electric and magnetic fields. The material qualities required to provide this electromagnetic shielding includes both electrical and magnetic conductivity. Those with skill in the art will readily see other materials which provide both electromagnetic conductivity for shielding and a sufficient modulus of elasticity for resiliency. Those with skill in the art will also see that a plastic, or other material, bellows having an electromagnetically conductive coating may be substituted as an equivalent for the solid metal bellows disclosed herein.

The disclosed electromagnetic rotary seal successfully demonstrates the use of the resilient bellows concept for EMI and EMP protection. Though the disclosed use is specialized, it will find application in other areas where required shielding must tolerate manufacturing tolerances, misalignments and other part movements tending to interrupt the seal.

It is understood that certain modifications to the invention as described may be made, as might occur to one with skill in the field of the invention, within the intended scope of the claims. Therefore, all embodiments contemplated have not been shown in complete detail. Other embodiments may be developed without departing from the spirit of the invention or from the scope of the claims.

I claim:

1. An electromagnetic pulse rotary seal for a shaft extending through an opening in an enclosure, comprising an electromagnetically conductive resilient bellows surrounding the shaft outside the enclosure opening, the bellows having a first open end attached to the shaft, a second open end biased against the enclosure around the enclosure opening, and wherein the bellows has a passivated surface area in contact with the enclosure for reducing electromagnetic leakage past said surface area.

2. An electromagnetic pulse rotary seal for a shaft extending through an opening in an enclosure, comprising an electromagnetically conductive resilient bellows surrounding the shaft outside the enclosure opening, the bellows having a first open end attached to the shaft, a second open end biased against the enclosure around the enclosure opening, and wherein the enclosure has a passivated surface area in contact with the bellows for reducing electromagnetic leakage past said surface area.

* * * * *